(12) United States Patent
Zilber et al.

(10) Patent No.: US 6,972,480 B2
(45) Date of Patent: Dec. 6, 2005

(54) METHODS AND APPARATUS FOR PACKAGING INTEGRATED CIRCUIT DEVICES

(75) Inventors: Gil Zilber, Ramat Gan (IL); Reuven Katraro, Rishon le Zion (IL); Julia Aksenton, Jerusalem (IL); Vage Oganesian, Bet-Shemesh (IL)

(73) Assignee: Shellcase Ltd., Jerusalem (IL)

( * ) Notice: Subject to any disclaimer, the term of this patent is extended or adjusted under 35 U.S.C. 154(b) by 4 days.

(21) Appl. No.: 10/462,576

(22) Filed: Jun. 16, 2003

(65) Prior Publication Data

US 2004/0251525 A1 Dec. 16, 2004

(51) Int. Cl.[7] .......................... H01L 23/02; H01L 23/495
(52) U.S. Cl. .......................... 257/678; 257/676; 257/686
(58) Field of Search ................................. 257/676–690

(56) References Cited

U.S. PATENT DOCUMENTS

| | | |
|---|---|---|
| 2,507,956 A | 5/1950 | Bruno et al. |
| 2,851,385 A | 9/1958 | Spruance et al. |
| 3,981,023 A | 9/1976 | King et al. |
| 4,259,679 A | 3/1981 | Knibb et al. |
| 4,279,690 A | 7/1981 | Dierschke |
| 4,339,689 A | 7/1982 | Yamanaka et al. |
| 4,551,629 A | 11/1985 | Carson et al. |
| 4,764,846 A | 8/1988 | Go |
| 4,794,092 A | 12/1988 | Solomon |
| 4,797,179 A | 1/1989 | Watson et al. |
| 4,862,249 A | 8/1989 | Carlson |
| 4,933,601 A | 6/1990 | Sagawa et al. |
| 4,984,358 A | 1/1991 | Nelson |
| 5,104,820 A | 4/1992 | Go, deceased et al. |
| 5,118,924 A | 6/1992 | Mehra et al. |
| 5,124,543 A | 6/1992 | Kawashima |
| 5,126,286 A | 6/1992 | Chance |
| 5,177,753 A | 1/1993 | Tanaka |
| 5,250,462 A | 10/1993 | Sasaki et al. |
| 5,266,501 A | 11/1993 | Imai |
| 5,266,833 A | 11/1993 | Capps |
| 5,321,303 A | 6/1994 | Kawahara et al. |
| 5,500,540 A | 3/1996 | Jewell et al. |
| 5,526,449 A | 6/1996 | Meade et al. |
| 5,546,654 A | 8/1996 | Wojnarowski et al. |
| 5,567,657 A | 10/1996 | Wojnarowski et al. |
| 5,595,930 A | 1/1997 | Baek |
| 5,612,570 A | 3/1997 | Eide et al. |
| 5,657,206 A | 8/1997 | Pedersen et al. |
| 5,661,087 A | 8/1997 | Pedersen et al. |
| 5,672,519 A | 9/1997 | Song et al. |
| 5,675,180 A | 10/1997 | Pedersen et al. |
| 5,677,200 A | 10/1997 | Park et al. |
| 5,703,400 A | 12/1997 | Wojnarowski et al. |
| 5,796,370 A | 8/1998 | Courtonne et al. |
| 5,814,894 A | 9/1998 | Igarashi et al. |
| 5,817,541 A | 10/1998 | Averkiou et al. |
| 5,837,566 A | 11/1998 | Pedersen et al. |
| 5,849,623 A | 12/1998 | Wojnarowski et al. |

(Continued)

FOREIGN PATENT DOCUMENTS

| | | |
|---|---|---|
| WO | WO 85/02283 | 5/1985 |
| WO | WO 89/04113 | 5/1989 |
| WO | WO 95/19645 | 7/1995 |

*Primary Examiner*—Cuong Nguyen
(74) *Attorney, Agent, or Firm*—Ladas & Parry LLP

(57) ABSTRACT

An integrally packaged integrated circuit device including an integrated circuit die including a crystalline substrate having first and second generally planar surfaces and edge surfaces and an active surface formed on the first generally planar surface, at least one chip scale packaging layer formed over the active surface and at least one electrical contact formed over the at least one chip scale packaging layer, the at least one electrical contact being connected to circuitry on the active surface by at least one pad formed on the first generally planar surface.

11 Claims, 10 Drawing Sheets

U.S. PATENT DOCUMENTS

| | | |
|---|---|---|
| 5,857,858 A | 1/1999 | Gorowitz et al. |
| 5,859,475 A | 1/1999 | Freyman et al. |
| 5,869,353 A | 2/1999 | Levy et al. |
| 5,888,884 A | 3/1999 | Wojnarowski |
| 5,891,761 A | 4/1999 | Vindasius et al. |
| 5,900,674 A | 5/1999 | Wojnarowski et al. |
| 5,909,052 A | 6/1999 | Ohta et al. |
| 5,938,452 A | 8/1999 | Wojnarowski |
| 5,952,712 A | 9/1999 | Ikuina et al. |
| 5,965,933 A | 10/1999 | Young et al. |
| 5,985,695 A | 11/1999 | Freyman et al. |
| 5,986,746 A | 11/1999 | Metz et al. |
| 5,993,981 A | 11/1999 | Askinazi et al. |
| 6,002,163 A | 12/1999 | Wojnarowski |
| 6,020,217 A | 2/2000 | Kuisl et al. |
| 6,046,410 A | 4/2000 | Wojnarowski et al. |
| 6,072,236 A | 6/2000 | Akram et al. |
| 6,080,596 A | 6/2000 | Vindasius et al. |
| 6,092,280 A | 7/2000 | Wojnarowski |
| 6,098,278 A | 8/2000 | Vindasius et al. |
| 6,124,637 A | 9/2000 | Freyman et al. |
| 6,134,118 A | 10/2000 | Pedersen et al. |
| 6,235,141 B1 | 5/2001 | Feldman et al. |
| 6,265,763 B1 * | 7/2001 | Jao et al. .................... 257/676 |
| 6,548,911 B2 * | 4/2003 | Yu et al. ..................... 257/786 |
| 6,624,505 B2 * | 9/2003 | Badehi ....................... 257/678 |
| 6,646,289 B1 | 11/2003 | Badehi |
| 6,768,190 B2 * | 7/2004 | Yang et al. ................. 257/686 |

* cited by examiner

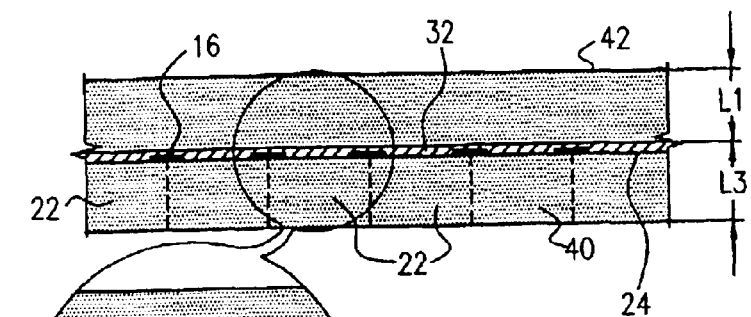
FIG. 3A
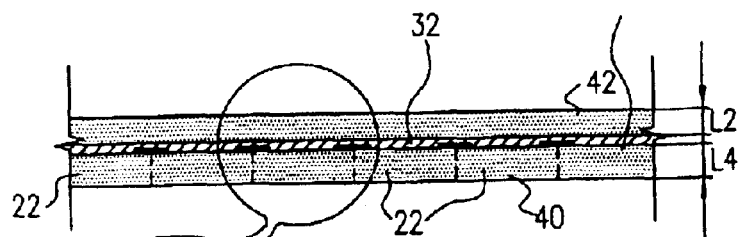
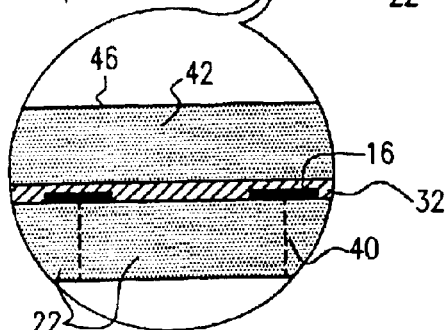
FIG. 3B
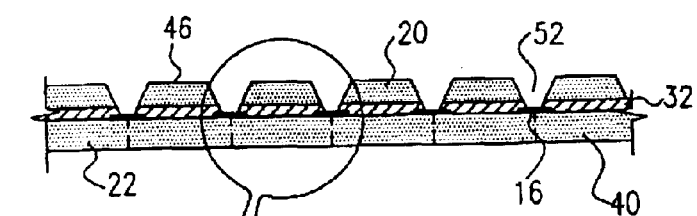
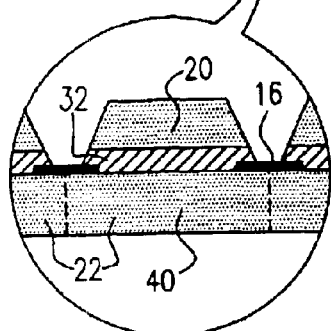
FIG. 3C

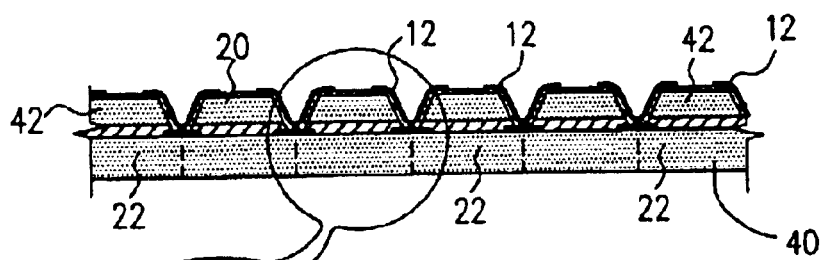
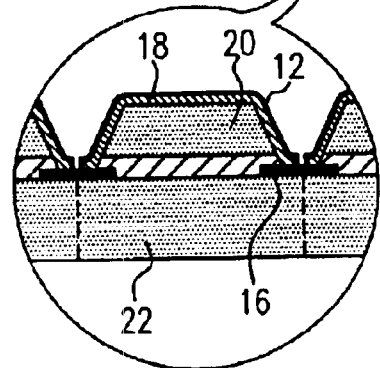
FIG. 3G
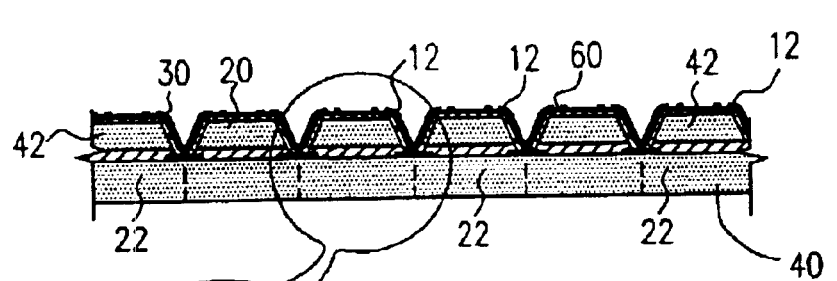
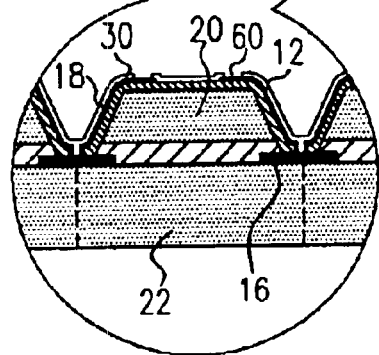
FIG. 3H

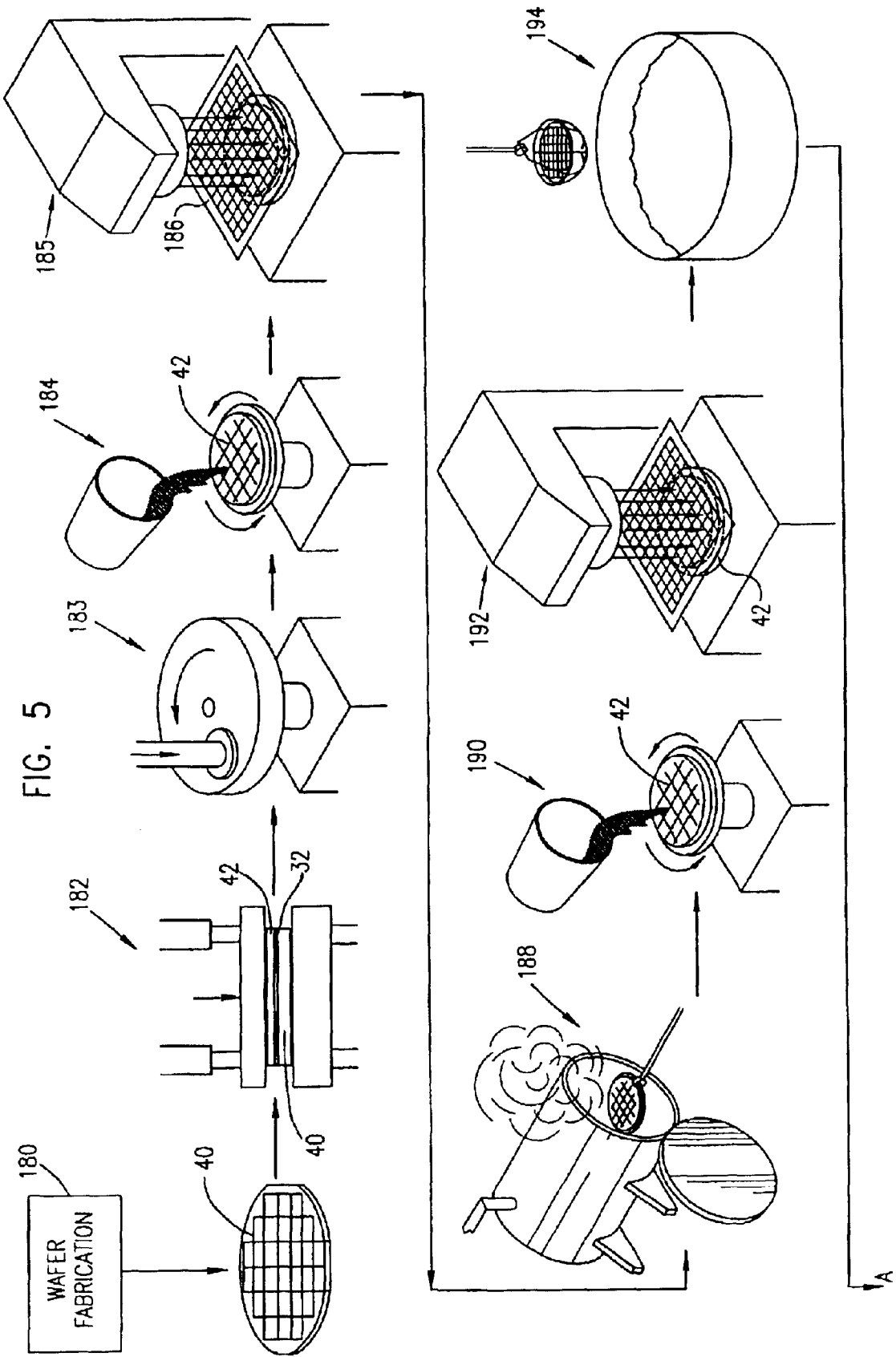

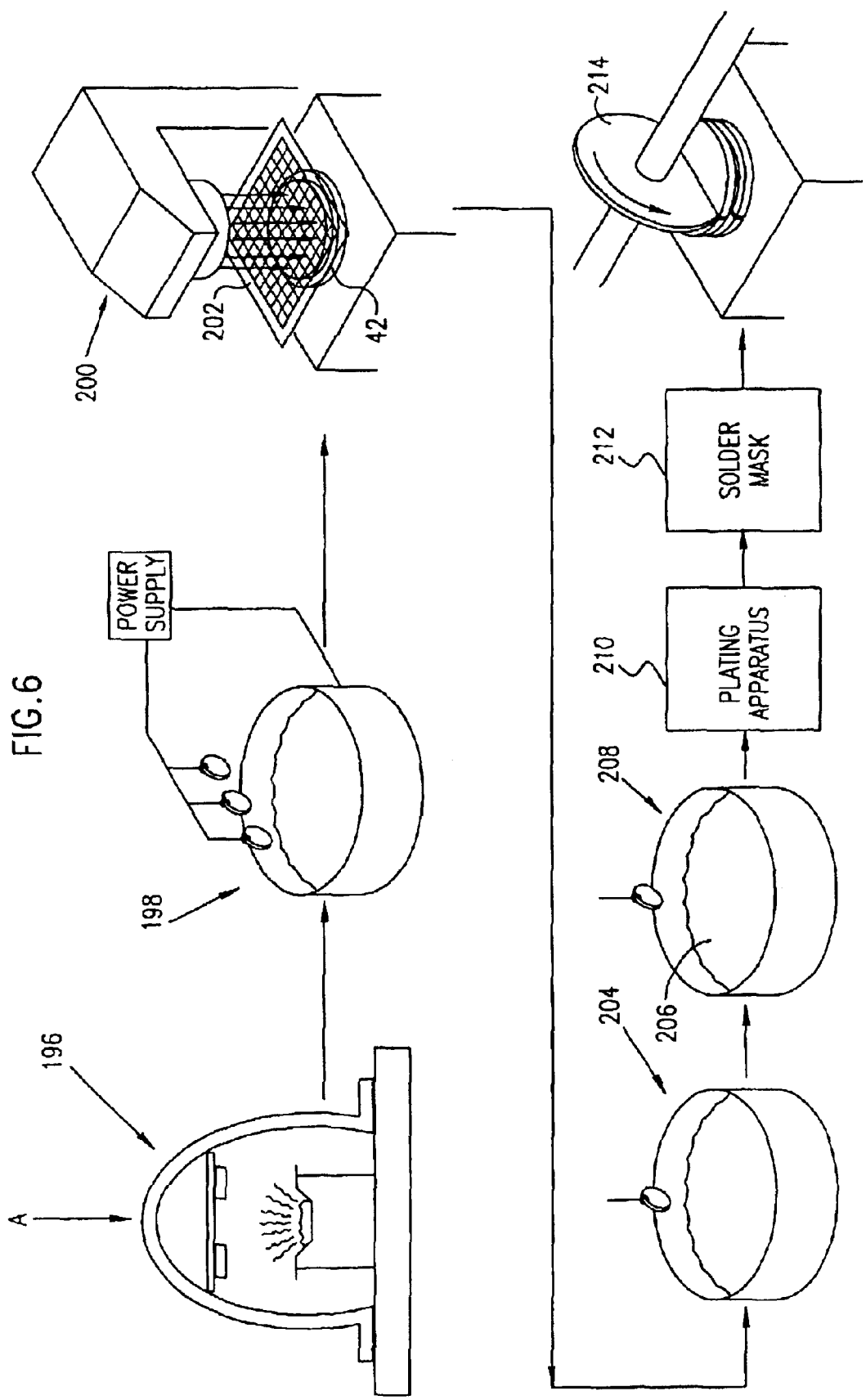

METHODS AND APPARATUS FOR PACKAGING INTEGRATED CIRCUIT DEVICES

FIELD OF THE INVENTION

The present invention relates to methods and apparatus for producing integrated circuit devices and to integrated circuit devices produced thereby and more particularly to an integrally packaged die.

BACKGROUND OF THE INVENTION

An essential step in the manufacture of all integrated circuit devices is known as "packaging" and involves mechanical and environmental protection of a silicon chip which is at the heart of the integrated circuit as well as electrical interconnection between predetermined locations on the silicon chip and external electrical terminals.

At present three principal technologies are employed for packaging semiconductors: wire bonding, tape automatic bonding (TAB) and flip chip.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination ion and includes a pattern of copper traces suited thereto. The individual leads may be connected individually or as a group to the various bond pads on the chip.

Flip chips are integrated circuit dies which have solder bumps formed on top of the bonding pads, thus allowing the die to be "flipped" circuit side down and directly soldered to a substrate. Wire bonds are not required and considerable savings in package spacing may be realized.

The above-described technologies each have certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. The interconnection encounters problems of uniformity in the solder bumps as well as in thermal expansion mismatching, which limits available substrates to silicon or to materials which have thermal expansion characteristics similar to those of silicon.

Conventional semiconductor packaging terminology has defined the term chip scale packaging to include any packaging process with a ratio of packaging to die less than or equal to 1.2:1. Additionally, the packaging layer conventionally provides protection to the encased semiconductor or integrated circuit.

SUMMARY OF THE INVENTION

The present invention seeks to provide improved methods for producing integrated circuit devices.

There is thus provided in accordance with a preferred embodiment of the present invention an integrally packaged integrated circuit device including an integrated circuit die including a crystalline substrate having first and second generally planar surfaces and edge surfaces and an active surface formed on the first generally planar surface, at least one chip scale packaging layer formed over the active surface and at least one electrical contact formed over the at least one chip scale packaging layer, the at least one electrical contact being connected to circuitry on the active surface by at least one pad formed on the first generally planar surface.

Preferably, the at least one chip scale packaging layer is formed of a crystalline material. Additionally, the at least one chip scale packaging layer is formed of silicon. Alternatively, the crystalline substrate and the at least one chip scale packaging layer are both formed of silicon.

In accordance with another preferred embodiment of the present invention the integrally packaged integrated circuit device also includes an insulation layer formed over the at least one chip scale packaging layer and directly underlying the at least one electrical contact. Preferably, the insulation layer includes at least one of a passivation layer and a dielectric layer. Additionally, the insulation layer includes at least one of epoxy, silicon oxide, solder mask, silicon nitride, silicon oxinitride, polyimide, BCB™, parylene, polynaphthalenes, fluorocarbons and accrylates.

In accordance with yet another preferred embodiment of the present invention the integrally packaged integrated circuit device also includes at least one gap formed between the crystalline substrate and the at least one packaging layer. Additionally, the gap is formed as a recess in the at least one packaging layer.

In accordance with still another preferred embodiment of the present invention the integrally packaged integrated circuit device also includes at least one gap formed in the crystalline substrate.

In accordance with another preferred embodiment of the present invention the integrally packaged integrated circuit device also includes at least one gap formed in the crystalline substrate and at least one chip scale packaging layer formed underlying the crystalline substrate and sealing the gap formed in the crystalline substrate.

There is also provided in accordance with another preferred embodiment of the present invention a method of producing integrally packaged integrated circuit devices including providing a plurality of integrated circuit dies formed on a wafer, each of the dies having first and second generally planar surfaces, and an active surface and at least one pad formed on the first generally planar surface, the active surface including circuitry, forming at least one chip scale packaging layer over the active surface, forming at least one electrical contact over the at least one chip scale packaging layer, the at least one electrical contact being connected to the circuitry by the at least one pad and subsequently dicing the wafer to define a plurality of packaged integrated circuit devices.

In accordance with another preferred embodiment of the present invention the forming at least one chip scale packaging layer includes forming at least one crystalline material chip scale packaging layer. Alternatively, the forming at least one chip scale packaging layer includes forming at least one silicon chip scale packaging layer. Additionally or alternatively, the forming at least one chip scale packaging layer includes forming at least one silicon chip scale packaging layer and the providing a plurality of integrated circuit dies formed on a wafer includes providing a plurality of integrated circuit dies formed on a silicon wafer.

In accordance with yet another preferred embodiment of the present invention the method also includes forming an insulation layer over the at least one chip scale packaging layer and wherein the forming at least one electrical contact includes forming the at least one electrical contact directly over the insulation layer.

In accordance with still another preferred embodiment of the present invention the method also includes forming at least one gap between the plurality of dies and the at least one packaging layer. Additionally, the forming at least one gap includes forming a recess in the at least one packaging layer. Alternatively, the forming at least one gap includes forming at least one gap in the plurality of dies. Alternatively, the method also includes forming at least one gap in the plurality of dies.

In accordance with another preferred embodiment of the present invention the method also includes forming at least one gap in the plurality of dies and forming at least one chip scale packaging layer over the second generally planar surface, thereby sealing the gap.

In accordance with yet another preferred embodiment of the present invention the forming at least one chip scale packaging layer includes bonding the chip scale packaging layer to the plurality of dies using a bonding layer. Preferably, the bonding layer includes at least one of an adhesive, intermetallic bonding and anodic bonding.

In accordance with still another preferred embodiment of the present invention the forming at least one chip scale packaging layer also includes thinning the packaging layer from an original thickness to a decreased thickness. Preferably, the thinning includes at least one of grinding, lapping and etching. Additionally, the decreased thickness is approximately between 50–250 microns.

In accordance with still another preferred embodiment of the present invention the method also includes thinning the plurality of dies from an original thickness to a decreased thickness, subsequent to the forming at least one chip scale packaging layer and prior to the dicing. Preferably, the thinning includes at least one of grinding, lapping and etching. Additionally, the decreased thickness is approximately between 10–150 microns. Additionally, the thinning includes thinning the second planar surface.

In accordance with another preferred embodiment of the present invention the method also includes forming at least one first gap in the plurality of dies and forming at least one second gap in the at least one chip scale packaging layer, the second gap communicating with the first gap. Additionally, the method also includes forming at least one chip scale packaging layer over the second generally planar surface, thereby sealing the first gap.

In accordance with yet another preferred embodiment of the present invention the at least one chip scale packaging layer over the second generally planar surface includes at least one of silicon, glass, metal, plastic, thermoplastic, thermosetting and ceramic.

Preferably, the forming at least one chip scale packaging layer over the second generally planar surface includes bonding the chip scale packaging layer over the second generally planar surface to the plurality of dies using a bonding layer. Additionally, the bonding layer includes at least one of an adhesive, intermetallic bonding and anodic bonding.

In accordance with still another preferred embodiment of the present invention the forming at least one chip scale packaging layer over the second generally planar surface also includes thinning the packaging layer from an original thickness to a decreased thickness. Preferably, the thinning includes at least one of grinding, lapping and etching. Additionally, the decreased thickness is approximately between 50–250 microns.

BRIEF DESCRIPTION OF THE DRAWINGS

The present invention will be understood and appreciated more fully from the following detailed description, taken in conjunction with the drawings in which:

FIGS. 3A, 3B, 3C, 3D, 3E, 3F, 3G, 3H, 3I and 3J are sectional illustrations of various stages in the manufacture of integrally packaged integrated circuit devices in accordance with a preferred embodiment of the present invention;

FIGS. 5 and 6 together provide a simplified block diagram illustration of apparatus for carrying out the method of the present invention.

DETAILED DESCRIPTION OF PREFERRED EMBODIMENTS

Figure 1A:
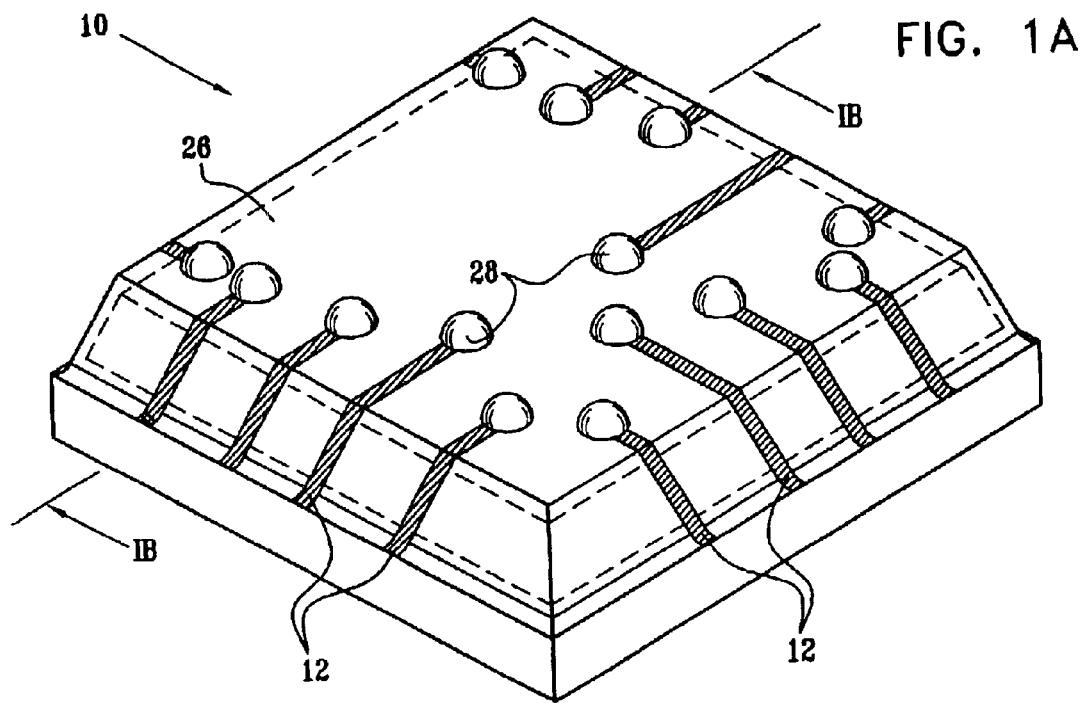
FIGS. 1A and 1B are, respectively, a simplified pictorial illustration and a simplified sectional illustration of an integrally packaged integrated circuit device constructed and operative in accordance with a preferred embodiment of the present invention, the sectional illustration being taken along lines IB—IB in FIG. 1A.

Reference is now made to FIGS. 1A–3J, which illustrate integrated circuit devices, and the production thereof, in accordance with a preferred embodiment of the present invention. As seen in FIGS. 1A and 1B, the integrated circuit device includes a relatively thin and compact, environmentally protected and mechanically strengthened, integrated circuit package 10, having a multiplicity of electrical conductors 12.

It is a particular feature of the present invention that conductors 12 are electrically connected to pads 16, and are preferably formed directly over an insulation layer 18 overlying at least one chip scale packaging layer 20 overlying an integrated circuit die 22 having an active surface 24. Alternatively insulation layer 18 may be partially or entirely obviated. Insulation layer 18 may be any suitable insulation layer, such as a dielectric layer or a passivation layer. Pads 16 are connected to circuitry on the active surface 24. Preferably the chip scale packaging layer 20 is formed of a crystalline material, most preferably silicon.

Figure 1B:
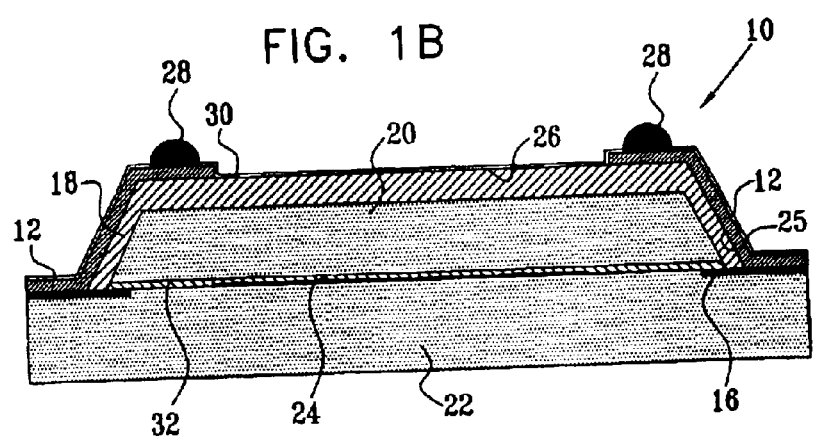

In accordance with a preferred embodiment of the invention, conductors 12 extend over edge surfaces 25 onto a planar surface 26 of the insulation layer 18. This contact arrangement permits flat surface mounting of package 10 onto a circuit board. As seen in FIGS. 1A and 1B, integrated circuit package 10 may also include contact bumps, such as solder bumps 28 formed on electrical conductors 12, at apertures formed in a solder mask 30 formed over insulation layer 18 and packaging layer 20.

The integrated circuit package 10, shown in FIGS. 1A and 1B, also includes a bonding layer 32, used to attach packaging layer 20 to integrated circuit die 22, as described hereinbelow.

It is appreciated that the methods described hereinbelow provide integrated circuit packages 10 that are in the range defined as chip scale packages, typically no more than 20% larger in area than the size of the chip. It is also appreciated that the methods described hereinbelow provide integrated circuit packages 10 in which the packaging process is carried out at wafer level up to dicing of a wafer-wise package into separate packaged dies.

Figure 2A:
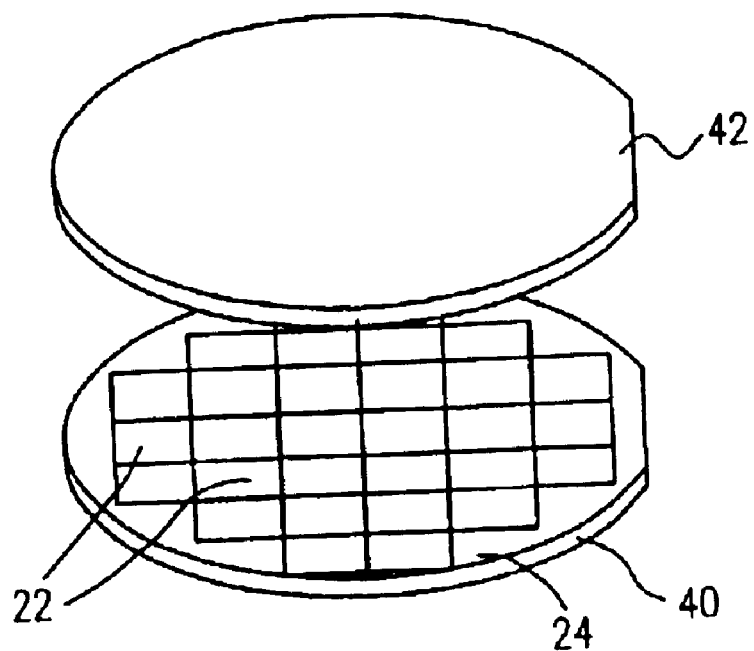
FIGS. 2A and 2B are simplified pictorial illustrations of the attachment of a protective insulating cover plate to a wafer containing a plurality of integrated circuit dies in accordance with a preferred embodiment of the present invention.
Figure 2B:
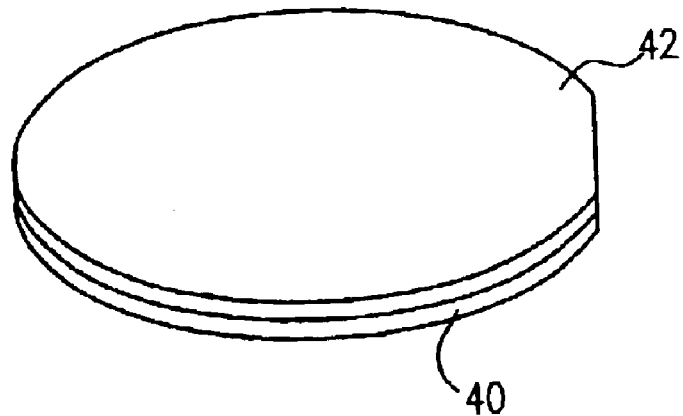

FIGS. 2A and 2B are simplified pictorial illustrations of the attachment of a protective insulating chip scale packaging layer plate to a wafer, preferably formed of silicon and containing a plurality of integrated circuit dies in accordance with the present invention. As seen in FIGS. 2A and 2B, typically a silicon wafer 40 has a plurality of finished dies 22 formed thereon by conventional techniques, and is bonded at active surfaces 24 of dies 22 onto a chip scale packaging layer plate 42.

In accordance with a preferred embodiment of the present invention, as illustrated in FIG. 3A, wafer 40, having a plurality of finished dies 22 formed thereon by conventional techniques, is bonded at active surfaces 24 to plate 42 by bonding layer 32. Bonding layer 32 may include one or more of an adhesive such as epoxy or polyurethane, intermetallic bonding such as solder and anodic bonding. Alternatively, bonding layer 32 may include any other suitable bonding material. As seen in FIG. 3A, electrical pads 16 are formed on the active surfaces 24 defined on wafer 40.

It is appreciated that certain steps in the conventional fabrication of silicon wafer 40 may be eliminated when the wafer is used in accordance with the present invention. These steps include the provision of via openings above pads, wafer back grinding and wafer back metal coating.

Following the bonding step described hereinabove, chip scale packaging layer plate 42 is preferably thinned from an original thickness L1, typically in the range of 400 to 1000 microns, to a decreased thickness L2, typically in the range of 50–250 microns, as shown in FIG. 3B. Thinning of chip scale packaging layer plate 42 may be achieved by grinding, lapping, etching or any other suitable method.

Similarly, the silicon wafer 40 is preferably thinned from an original thickness L3, typically in the range of 400 to 1000 microns, to a decreased thickness L4, typically in the range of 10–150 microns, as shown in FIG. 3B. Alternatively, when employing a silicon on isolator process, wafer 40 may be thinned to a decreased thickness approximating 0 microns, leaving only the circuitry and pads on the active surface 24 bonded to the packaging layer plate 42. Thinning of wafer 40 may be achieved by grinding, lapping, etching or any other suitable method. As seen in FIG. 3B, wafer 40 is preferably thinned on a planar surface opposite active surface 24. This reduction in wafer thickness is enabled by the additional mechanical strength provided by the bonding thereto of plate 42. The reduction in thickness of the silicon wafer need not necessarily take place at this stage, but may take place at any suitable later stage.

Following the reduction in thickness of the chip scale packaging layer plate 42, which is optional, the chip scale packaging layer plate 42, preferably formed of silicon, is etched, using a photolithography process, along its top surface 46 along predetermined dice lines that separate the individual dies. Etched channels 52 are thus produced, which extend entirely through the thickness of the chip scale packaging layer plates 42, typically in the range of 50–250 microns, and through the bonding layer 32 as well as any other layers, such as insulation layers which may be present, thereby exposing pads 16. The etched packaged wafer, including a plurality of chip scale packaging layers 20 and a corresponding plurality of integrated circuit dies 22 bonded thereto, is shown in FIG. 3C.

The aforementioned etching typically is achieved by a dry etching process using $CF_6$, $C_4F_8$ or other suitable dry etching gasses. Alternatively, the etching takes place in conventional silicon etching solution, such as a combination of 2.5% hydrofluoric acid, 50% nitric acid, 10% acetic acid and 37.5% water, so as to etch the chip scale packaging layer plate 42 down to the bonding layer 32, as shown in FIG. 3C.

The result of the silicon etching is a plurality of chip scale packaging layer 20, each of which includes silicon of thickness in the range of 50–250 microns.

Figure 3D:
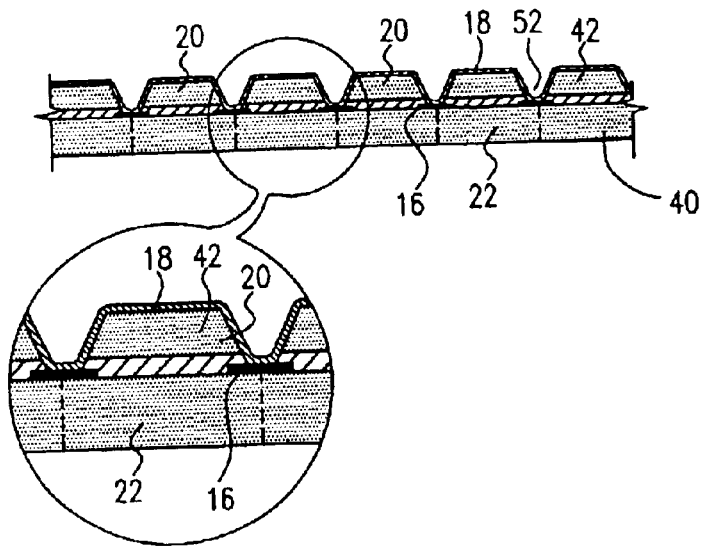

As seen in FIG. 3D, etched channels 52 are preferably coated with a dielectric material, such as epoxy, silicon oxide, solder mask, or any other suitable dielectric material, such as silicon nitride, silicon oxinitride, polyimide, BCB™, parylene, polynaphthalenes, fluorocarbons or accrylates. The resulting insulation layer 18 is preferably formed by spin coating, or may be formed by any suitable method, such as spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition.

Figure 3E:
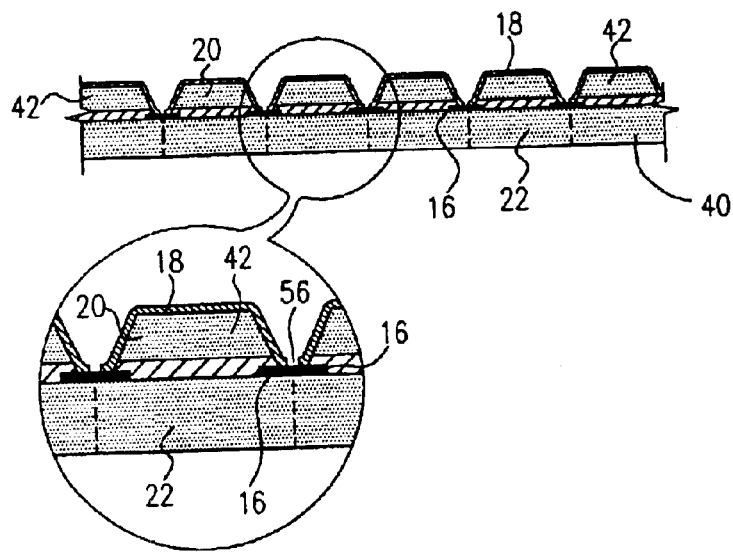

Following the formation of insulation layer 18, as seen in FIG. 3E, an opening 56 is formed in the insulation layer 18 between each pair of adjacent dies, by any suitable method. Openings 56 extend through insulation layer 18, thereby exposing pads 16.

Figure 3F:
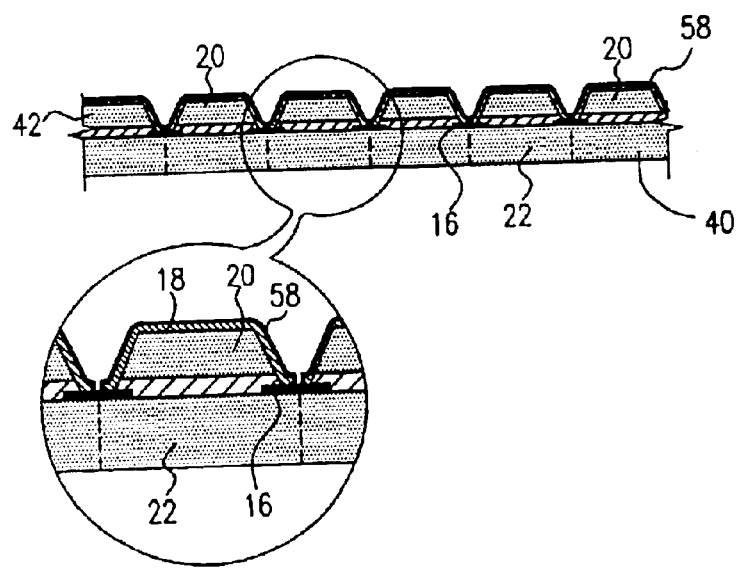

FIG. 3F shows the formation of a conductive layer 58, which covers insulation layer 18 and extends into openings 56. Conductive layer 58 is preferably formed of aluminum, or may be formed of any suitable conductive material or combination of materials, such as aluminum, copper, titanium, titanium tungsten, or chrome.

FIG. 3G shows patterning of the conductive layer 58, typically by conventional photolithographic techniques, to define the plurality of conductors 12 which electrically contact edges of one or more pads 16 on dies 22 and are appropriately plated.

FIG. 3H shows the wafer being coated with a protective material, preferably solder mask 30 or other protective material such as parylene, BCB™, or polyamide, which is patterned to define apertures 60 therein, communicating with conductors 12.

Figure 3I:
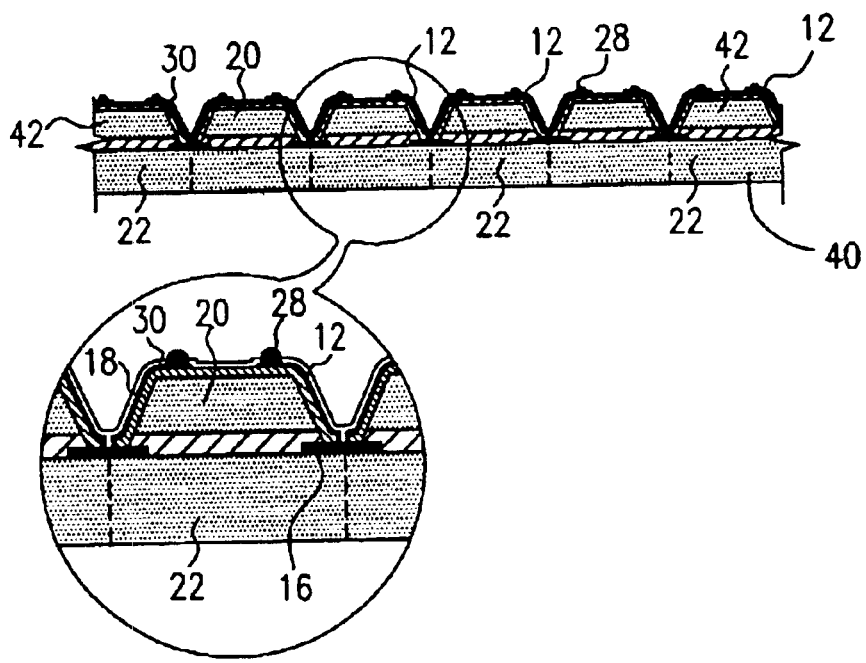

FIG. 3I shows the formation of contact bumps, such as solder bumps 28, at apertures 60 in electrical contact with conductors 12.

Figure 3J:
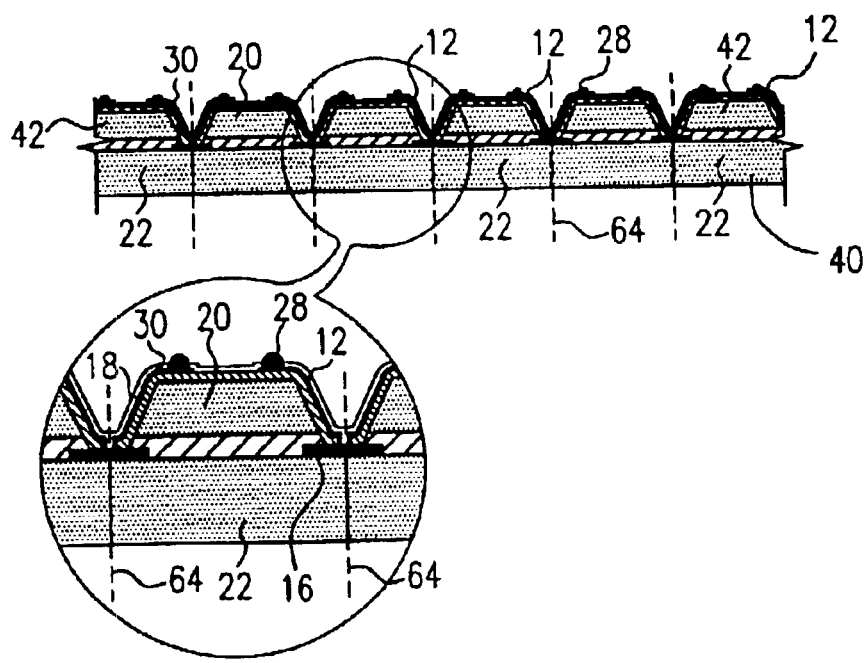

In accordance with a preferred embodiment of the present invention, the wafer is then diced, as shown in FIG. 3J, along lines 64, to provide individual integrated circuit packages, each including a single integrated circuit die 22 and being similar to integrated circuit package 10 of FIGS. 1A and 1B.

Figure 4:
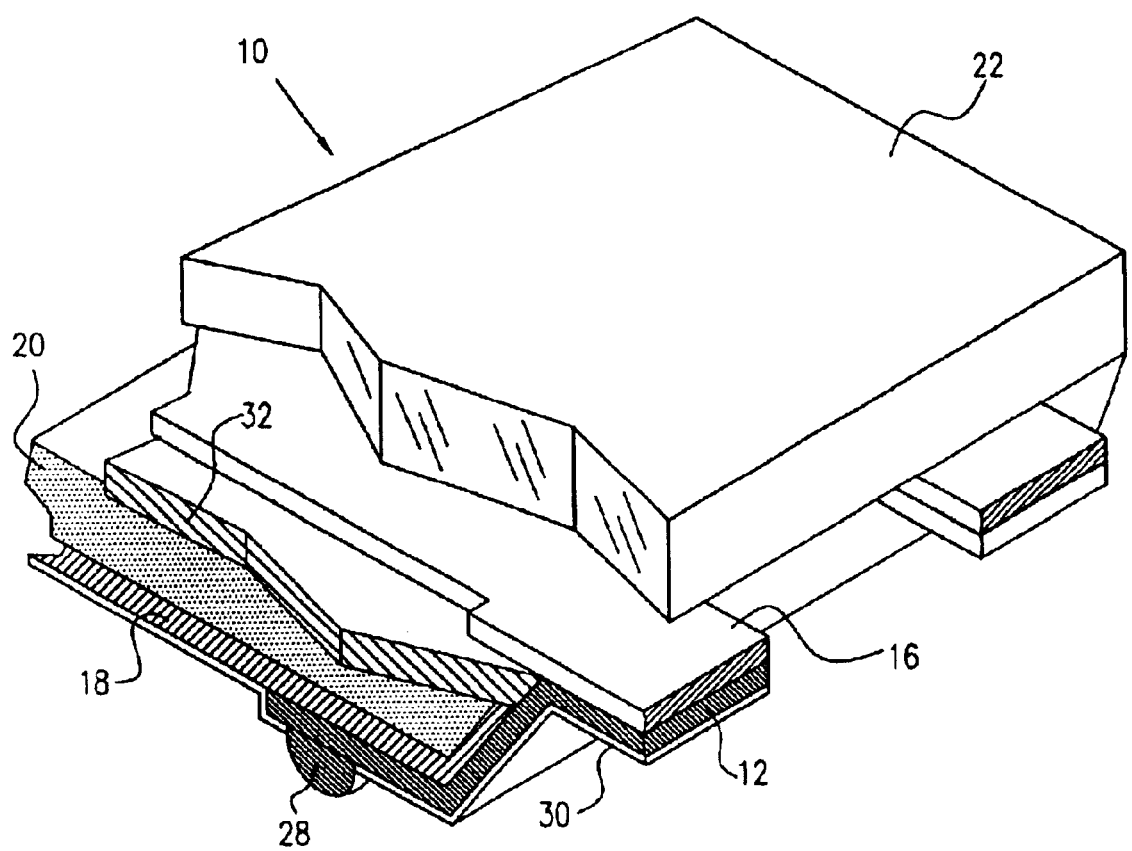
FIG. 4 is a partially cut away detailed pictorial illustration of an integrally packaged integrated circuit device produced from the wafer of FIG. 3J.

Reference is now made to FIG. 4, which is a partially cut away, detailed, pictorial illustration of an integrally packaged integrated circuit device 10 produced from the wafer of FIG. 3J. As seen in FIG. 4, the integrated circuit package 10 includes chip scale packaging layer 20, joined by bonding layer 32 to die 22. Edges of pads 16 are in electrical contact with conductors 12, which are directly formed over dielectric insulation layer 18, as described hereinabove.

Reference is now made to FIGS. 5 and 6, which together illustrate apparatus for producing integrated circuit devices in accordance with a preferred embodiment of the present invention. A conventional wafer fabrication facility 180 provides wafers 40. Individual wafers 40 are bonded on their active surfaces to chip scale packaging layer plates 42, such as silicon substrates, using bonding layer 32, by bonding apparatus 182, preferably having facilities for rotation of the wafer 40, the chip scale packaging layer plates 42 and the bonding layer 32 so as to obtain even distribution of the bonding layer 32.

The chip scale packaging layer plate 42 and optionally the wafer 40 bonded thereto (FIG. 2B) are thinned as by grinding apparatus 183, such as model BFG 841, which is commercially available from Disco Ltd. of Japan. The chip scale packaging layer plate 42 is then etched in a pattern preferably defined by using conventional photolithography techniques, such as by using conventional spin-coated photoresist as indicated by reference numeral 184. A suitable photoresist is commercially available from Hoechst, under the brand designation AZ 4562.

The photoresist is preferably mask exposed by a suitable UV exposure system 185, such as a Suss MicrTech AG, model MA200, through a lithography mask 186.

The photoresist is then developed in a development bath (not shown), baked and then the chip scale packaging layer plate is preferably etched by a dry etching process using $CF_6$, $C_4F_8$ or other suitable dry etching gasses. Commercially available equipment for this purpose includes a dry etch machine 188 manufactured by Surface Technology Systems of England.

Alternatively, the etching is achieved using a silicon etch solution located in a temperature controlled bath (not shown). Commercially available equipment for this purpose includes a Chemkleen bath and a WHRV circulator both of which are manufactured by Wafab Inc. of the U.S.A. A suitable wet etching conventional silicon etching solution is Isoform Silicon etch, which is commercially available from Micro-Image Technology Ltd. of England.

The packaged wafer is conventionally rinsed after etching and photoresist stripping is performed. The resulting etched wafer is shown in FIG. 3C.

The etched channels 52 in packaging layer plate 42 are then coated with insulation layer 18, as seen in step 190 and shown in FIG. 3D. Openings are formed in the insulation layer 18, preferably by using conventional photolithography techniques, to expose pads 16, as seen in step 192 and shown in FIG. 3E. Optionally, anti-corrosion treatment may be provided as seen in step 194.

Conductive layer deposition apparatus 196, which operates by vacuum deposition techniques, such as a sputtering machine manufactured by Balzers AG of Liechtenstein, is employed to produce a conductive layer 58 (FIG. 3F) over the chip scale packaging layer plate 42.

Configuration of conductors, as shown in FIG. 3G, is carried out preferably by using conventional electro-deposited photoresist, which is commercially available from DuPont under the brand name Primecoat or from Shipley, under the brand name Eagle. The photoresist is applied to the wafers in a photoresist bath assembly 198, which is commercially available from DuPont or Shipley.

The photoresist is preferably light configured by a UV exposure system 200, using a mask 202 to define suitable etching patterns. The photoresist is then developed in a development bath 204, and then etched in a metal etch solution 206 located in an etching bath 208, thus providing a conductor configuration such as that shown in FIGS. 1A and 1B.

The exposed conductive strips shown in FIG. 3G are then plated, preferably by an electroless plating apparatus 210, which is commercially available from Okuno of Japan.

Following plating of the conductive strips, the wafer is then coated with a solder mask as indicated at reference numeral 212 to define the locations 60 (FIG. 3H) of bumps 28, which are then formed in a conventional manner (FIG. 3I). Alternatively, the bumps 28 may not be required.

The wafer is then diced into individual pre-packaged integrated circuit devices by a dicing blade 214, as shown in FIG. 3J. Preferably, dicing blade 214 is a diamond resinoid blade of thickness 2–12 mils. The resulting packaged dies appear as illustrated generally in FIGS. 1A and 1B.

Figure 7A:
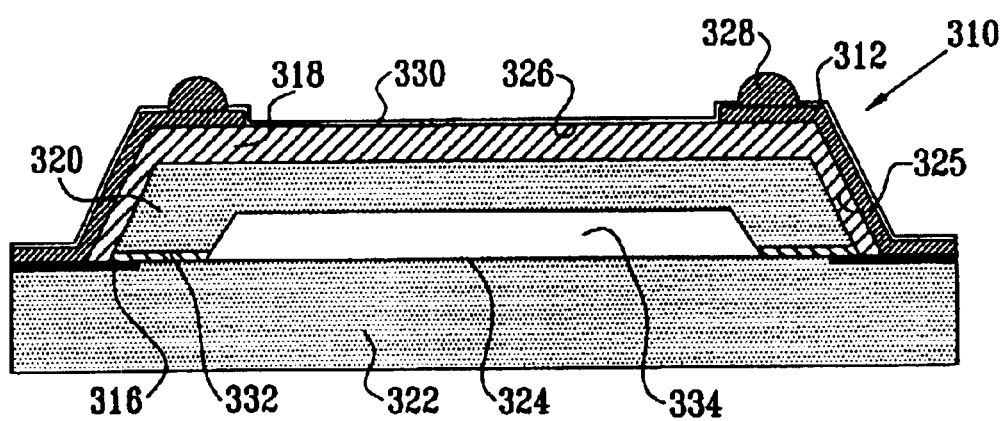
FIGS. 7A and 7B are simplified pictorial illustrations of two alternative embodiments of an integrally packaged integrated circuit device constructed and operative in accordance with yet another preferred embodiment of the present invention.
Figure 7B:
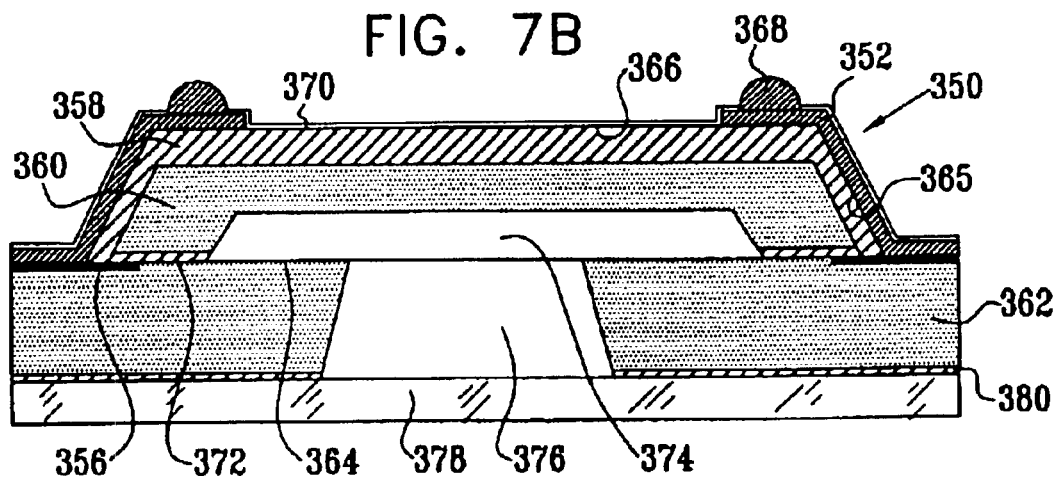

Reference is now made to FIGS. 7A and 7B, which illustrate two alternative preferred embodiments of integrated circuit devices, constructed and operative in accordance with a preferred embodiment of the present invention, each including a relatively thin and compact, environmentally protected and mechanically strengthened integrated circuit package having a multiplicity of electrical conductors plated directly over an insulation layer overlying a chip scale packaging layer.

FIG. 7A shows integrated circuit package 310, having a multiplicity of electrical conductors 312. Conductors 312 are electrically connected to pads 316, and are preferably formed directly over an insulation layer 318 overlying at least one chip scale packaging layer 320 overlying an integrated circuit die 322 having an active surface 324. Pads 316 are connected to circuitry on the active surface 324. Preferably the chip scale packaging layer 320 is formed of a crystalline material, most preferably silicon.

Conductors 312 extend over edge surfaces 325 onto a planar surface 326 of the insulation layer 318. This contact arrangement permits flat surface mounting of package 310 onto a circuit board. Integrated circuit package 310 may also include contact bumps, such as solder bumps 328 formed on electrical conductors 312, at apertures formed in a solder mask 330 formed over insulation layer 318 and packaging layer 320. The integrated circuit package 310 also preferably includes a bonding layer 332, used to attach packaging layer 320 to integrated circuit die 322. Bonding layer 332 may include one or more of an adhesive such as epoxy or polyurethane, intermetallic bonding such as solder and anodic bonding.

The embodiment of FIG. 7A is particularly characterized in that chip scale packaging layer 320 is formed with a recess 334 overlying the active surface 324 of the die 322.

FIG. 7B shows integrated circuit package 350, having a multiplicity of electrical conductors 352. Conductors 352 are electrically connected to pads 356, and are preferably formed directly over an insulation layer 358 overlying at least one chip scale packaging layer 360 overlying an integrated circuit die 362 having an active surface 364. Pads 356 are connected to circuitry on the active surface 364. Preferably the chip scale packaging layer 360 is formed of a crystalline material, most preferably silicon.

Conductors 352 extend over edge surfaces 365 onto a planar surface 366 of the package 350. This contact arrangement permits flat surface mounting of package 350 onto a circuit board. Integrated circuit package 350 may also include contact bumps, such as solder bumps 368 formed on electrical conductors 352, at apertures formed in a solder mask 370 formed over insulation layer 358 and packaging layer 360. The integrated circuit package 350 also preferably includes a bonding layer 372, used to attach packaging layer 360 to integrated circuit die 362. Bonding layer 372 may be one or more of an adhesive such as epoxy or polyurethane, intermetallic bonding such as solder and anodic bonding.

The embodiment of FIG. 7B is particularly characterized in that chip scale packaging layer 360 is formed with a recess 374 overlying the active surface 364 of the die 362 and that die 362 is formed with an opening 376 communicating with recess 374. An additional protective layer 378, typically formed of glass, is preferably attached to the underside of die 362, preferably in a waferwise manner prior to dicing. Protective layer 378 may be formed of silicon, glass, metal, plastic, thermoplastic, thermosetting, ceramic, any combination thereof, or any other suitable material. Preferably, integrated circuit package 350 also includes a bonding layer 380, used to attach additional protective layer 378 to die 362. Bonding layer 380 may be one or more of an adhesive such as epoxy or polyurethane, intermetallic bonding such as solder and anodic bonding.

In another preferred embodiment of the present invention, protective layer 378 is preferably thinned from an original thickness, typically in the range of 400 to 1000 microns, to a decreased thickness, typically in the range of 50–250 microns. Thinning of protective layer 378 may be achieved by grinding, lapping, etching or any other suitable method.

It will be appreciated by persons skilled in the art that the present invention is not limited to what has been particularly shown and described hereinabove. Rather the scope of the present invention includes both combinations and subcombinations of the various features described hereinabove as well as modifications and variations thereof as would occur to a person of skill in the art upon reading the foregoing specification and which are not in the prior art.

What is claimed is:

1. An integrally packaged integrated circuit device comprising:
   an integrated circuit die comprising:
      a crystalline substrate having first and second generally planar surfaces and edge surfaces; and
      an active surface formed on said first generally planar surface;
   at least one chip scale packaging layer formed over said active surface;
   at least one gap formed between said crystalline substrate and said at least one chip scale packaging layer; and
   at least one electrical contact formed over said at least one chip scale packaging layer, said at least one electrical contact being connected to circuitry on said active surface by at least one pad formed on said first generally planar surface.

2. An integrally packaged integrated circuit device according to claim 1 and wherein said at least one chip scale packaging layer is formed of a crystalline material.

3. An integrally packaged integrated circuit device according to claim 1 and wherein said crystalline substrate and said at least one chip scale packaging layer are both formed of silicon.

4. An integrally packaged integrated circuit device according to claim 1 and also comprising an insulation layer formed over said at least one chip scale packaging layer and directly underlying said at least one electrical contact.

5. An integrally packaged integrated circuit device according to claim 4 and wherein said insulation layer comprises at least one of a passivation layer and a dielectric layer.

6. An integrally packaged integrated circuit device according to claim 4 and wherein said insulation layer comprises at least one of epoxy, silicon oxide, solder mask, silicon nitride, silicon oxinitride, polyimide, BCB™, parylene, polynaphthalenes, fluorocarbons and acrylates.

7. An integrally packaged integrated circuit device according to claim 1 and wherein said at least one chip scale packaging layer is formed of silicon.

8. An integrally packaged integrated circuit device according to claim 1 and wherein said gap is formed as a recess in said at least one packaging layer.

9. An integrally packaged integrated circuit device according to claim 1 and also including at least one gap formed in said crystalline substrate.

10. An integrally packaged integrated circuit device according to claim 1 and also including at least one gap formed in said crystalline substrate.

11. An integrally packaged integrated circuit device according to claim 1 and also including at least one gap formed in said crystalline substrate and at least one chip scale packaging layer formed underlying said crystalline substrate and sealing said gap formed in said crystalline substrate.

* * * * *